US008767405B2

(12) United States Patent
Tokuda et al.

(10) Patent No.: US 8,767,405 B2
(45) Date of Patent: Jul. 1, 2014

(54) ELECTRONIC APPARATUS AND FLEXIBLE PRINTED CIRCUIT BOARD

(75) Inventors: Kota Tokuda, Ome (JP); Sadahiro Tamai, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 411 days.

(21) Appl. No.: 13/093,593

(22) Filed: Apr. 25, 2011

(65) Prior Publication Data
US 2012/0051004 A1    Mar. 1, 2012

(30) Foreign Application Priority Data
Aug. 31, 2010   (JP) ................. 2010-194366

(51) Int. Cl.
H05K 5/00    (2006.01)
(52) U.S. Cl.
USPC ........................... 361/752; 361/749; 174/254
(58) Field of Classification Search
USPC ........... 361/721, 760, 749; 174/254, 260–261
See application file for complete search history.

(56) References Cited

U.S. PATENT DOCUMENTS

| | | | | |
|---|---|---|---|---|
| 8,058,559 B2 * | 11/2011 | Muro et al. | ................. | 174/254 |
| 2009/0145632 A1 | 6/2009 | Zhang | | |
| 2009/0244859 A1 * | 10/2009 | Muro et al. | ................. | 361/749 |
| 2009/0294155 A1 | 12/2009 | Suzuki et al. | | |
| 2010/0326706 A1 * | 12/2010 | Muro et al. | ................. | 174/254 |

FOREIGN PATENT DOCUMENTS

| | | |
|---|---|---|
| JP | 10-341065 | 12/1998 |
| JP | 2005317946 | 11/2005 |
| JP | 2007-189091 | 7/2007 |
| JP | 2007-227559 | 9/2007 |
| JP | 2009-513023 | 3/2009 |
| JP | 2009290020 | 12/2009 |
| WO | 2007/048300 A1 | 5/2007 |

OTHER PUBLICATIONS

Japanese Patent Application No. 2010-194366, First Office Action, mailed Aug. 23, 2011, (with English Translation).

* cited by examiner

Primary Examiner — Hung S Bui
(74) Attorney, Agent, or Firm — Blakely, Sokoloff, Taylor & Zafman LLP

(57) ABSTRACT

According to one embodiment, an electronic apparatus includes a housing and a flexible printed circuit board accommodated in the housing. The flexible printed circuit board includes a base portion, an electrically conductive portion, a first adhesive portion, a cover portion, a rigid reinforcement plate, and a second adhesive portion. The electrically conductive portion is laminated to the base portion. The first adhesive portion is laminated to the conductive portion and includes a first opening. The cover portion is laminated to the first adhesive portion and includes a second opening continuous with the first opening. The rigid reinforcement plate is opposed to the cover portion. The second adhesive portion penetrates the first and second openings and is interposed between the cover portion and the reinforcement plate.

22 Claims, 8 Drawing Sheets

ELECTRONIC APPARATUS AND FLEXIBLE PRINTED CIRCUIT BOARD

CROSS-REFERENCE TO RELATED APPLICATIONS

This application is based upon and claims the benefit of priority from Japanese Patent Application No. 2010-194366, filed Aug. 31, 2010; the entire contents of which are incorporated herein by reference.

FIELD

Embodiments described herein relate generally to an electronic apparatus and a flexible printed circuit board.

BACKGROUND

A flexible printed circuit board (FPC) is used in an electronic apparatus, such as a portable computer. The FPC comprises, for example, a base layer and covering layer laminated to each other. The base layer includes a base layer film and conductive layer laminated to each other with an adhesive. The covering layer includes a covering layer film laminated to the conductive layer with an adhesive.

The FPC comprises a rigid reinforcement plate configured for improved strength and easier component mounting and assembly. The reinforcement plate is affixed to a surface of the covering layer with an adhesive.

The covering layer film of the FPC is formed of, for example, hygroscopic polyimide. When the adhesive of the FPC is thermally set, therefore, water absorbed by the covering layer film is evaporated. The evaporated water may produce air bubbles between the reinforcement plate and covering layer. These air bubbles may cause the reinforcement plate to separate from the covering layer.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings.

In general, according to one embodiment, an electronic apparatus includes a housing and a flexible printed circuit board accommodated in the housing. The flexible printed circuit board includes a base portion, an electrically conductive portion, a first adhesive portion, a cover portion, a rigid reinforcement plate, and a second adhesive portion. The electrically conductive portion is laminated to the base portion. The first adhesive portion is laminated to the conductive portion and includes a first opening. The cover portion is laminated to the first adhesive portion and includes a second opening continuous with the first opening. The rigid reinforcement plate is opposed to the cover portion. The second adhesive portion penetrates the first and second openings and is interposed between the cover portion and the reinforcement plate.

A first embodiment will now be described with reference to FIGS. 1 to 5. In this specification, the user side is defined as forward; the far side from the user as rearward, the user's left-hand side as leftward, the user's right-hand side as rightward, the upper side with respect to the user as upward, and the lower side with respect to the user as downward.

Figure 1:
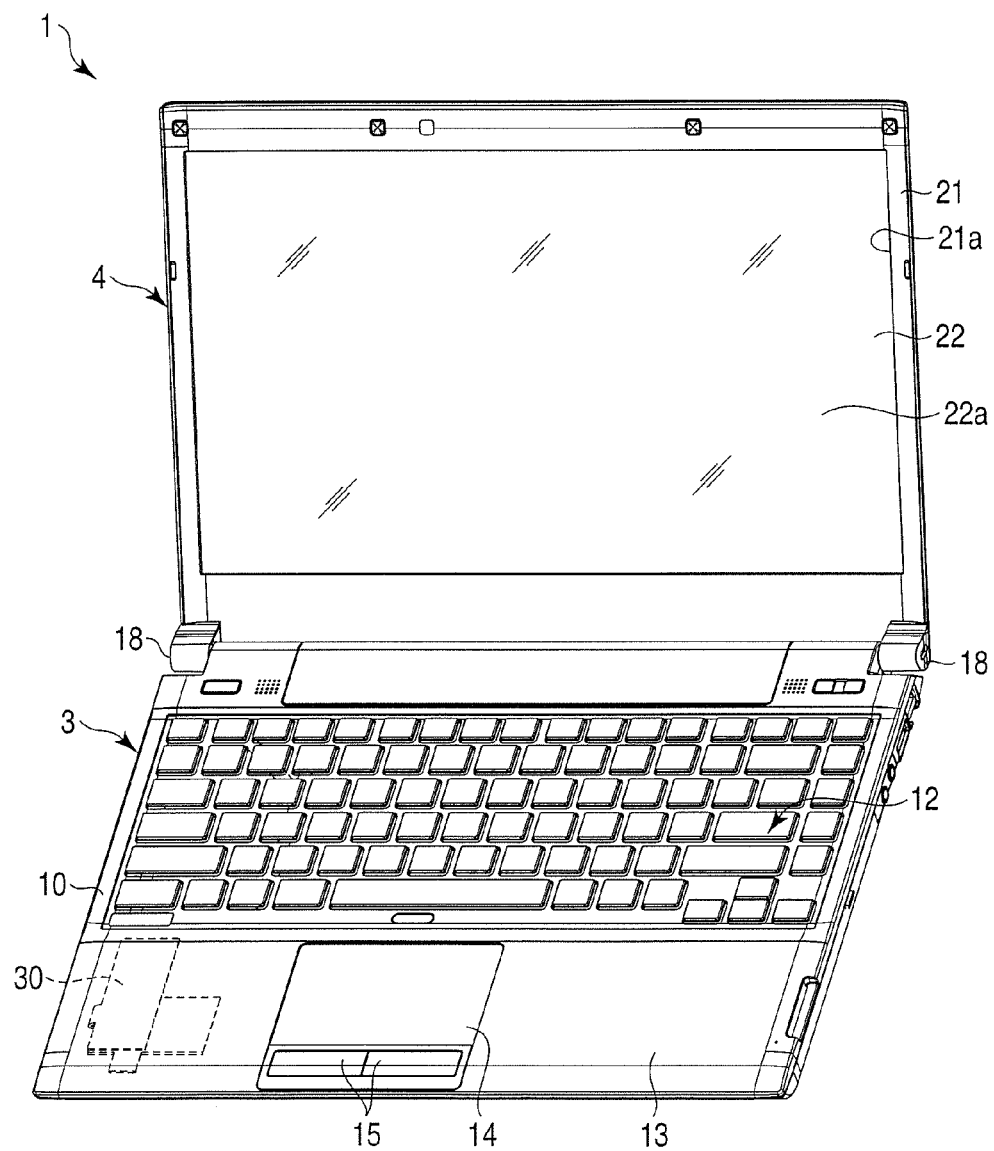
FIG. 1 is an exemplary perspective view showing a portable computer according to a first embodiment.

FIG. 1 is an exemplary perspective view of a portable computer 1 according to the first embodiment. The portable computer 1 is an example of the electronic apparatus. As shown in FIG. 1, the computer 1 comprises a main unit 3 and display unit 4.

The main unit 3 comprises a flat box-like housing 10. A keyboard 12, palmrest 13, touchpad 14, and a pair of buttons 15 are arranged on the upper surface of the housing 10.

As shown in FIG. 1, a pair of hinges 18 connect the display unit 4 and main unit 3. The hinges 18 are individually arranged at the rear end of the housing 10.

The display unit 4 is pivotable around the hinges 18 between closed and open positions. In the closed position, the display unit 4 lies on the main unit 3. In the open position, the display unit 4 rises from the rear end of the main unit 3.

The display unit 4 comprises a flat box-like display housing 21 and display module 22. The display module 22 is, for example, a liquid crystal display accommodated in the display housing 21.

A display aperture 21a is formed in the front surface of the display housing 21. A screen 22a of the display module 22 is exposed to the outside of the display unit 4 through the display aperture 21a.

A folded flexible printed circuit board (FPC) 30 is accommodated in the housing 10. The FPC 30 is electrically connected to, for example, other circuit boards and electronic components within the housing 10.

Figure 2:
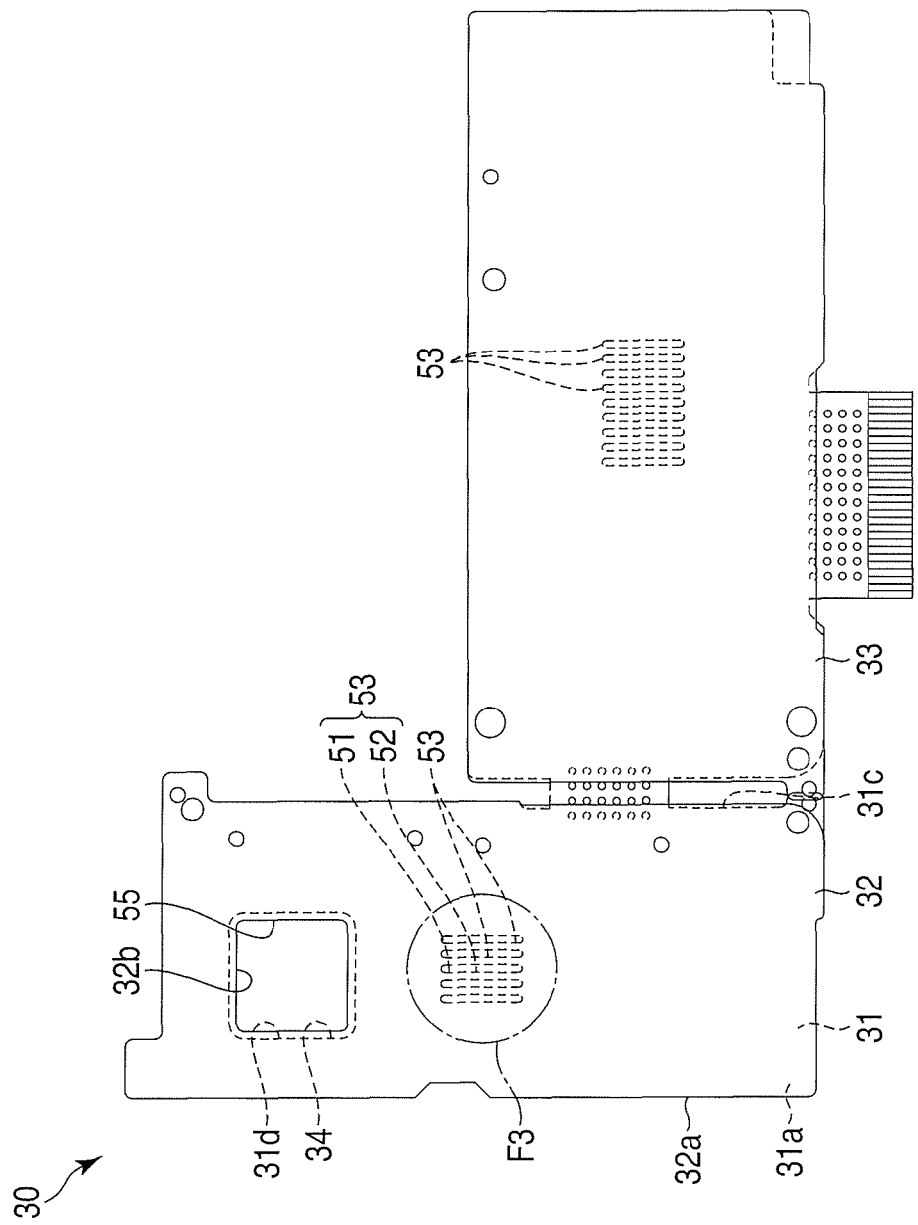
FIG. 2 is an exemplary plan view showing an FPC of the first embodiment.

FIG. 2 is an exemplary plan view showing the FPC 30. The FPC 30 comprises a board body 31 and two reinforcement plates 32 and 33. The board body 31 is substantially L-shaped and flexible.

Figure 4:
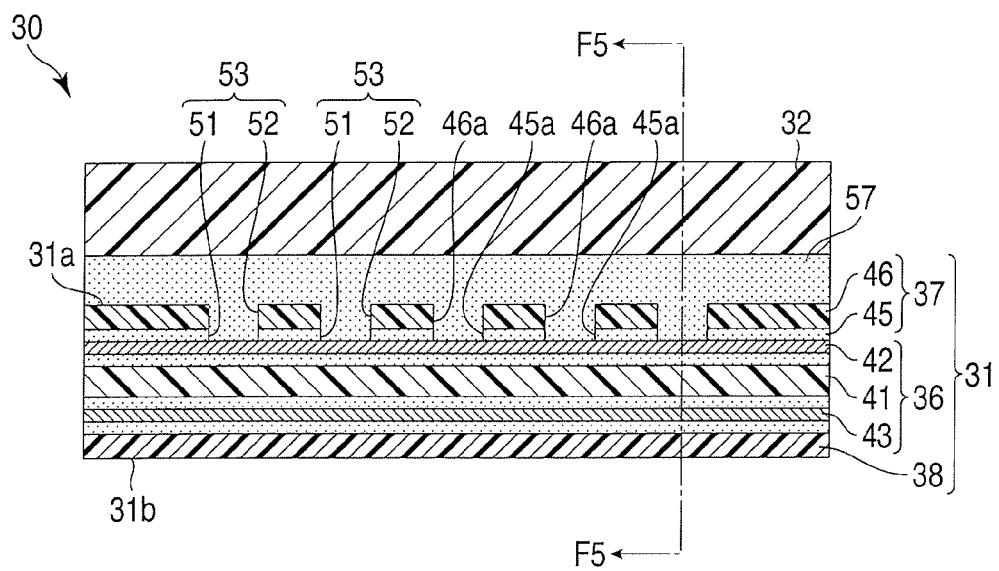
FIG. 4 is an exemplary sectional view of the FPC of the first embodiment taken along line F4-F4 of FIG. 3.

The board body 31 comprises a first surface 31a and second surface 31b (FIG. 4). The reinforcement plates 32 and 33 are individually attached to the first surface 31a of the board body 31. A plurality of electronic components are mounted on the second surface 31b of the board body 31. The board body 31 comprises a first hole 34.

Figure 3:
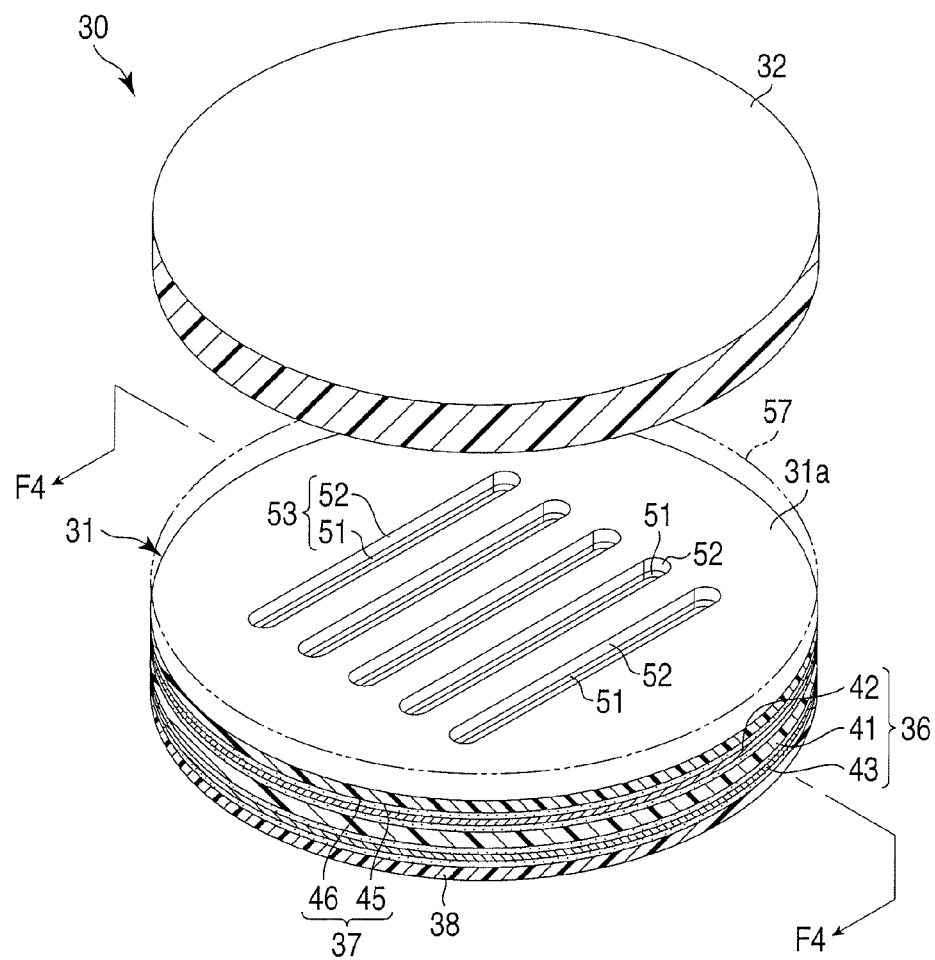
FIG. 3 is an exemplary exploded perspective view of the FPC of the first embodiment, showing a region enclosed by circle F3 in FIG. 2.
Figure 5:
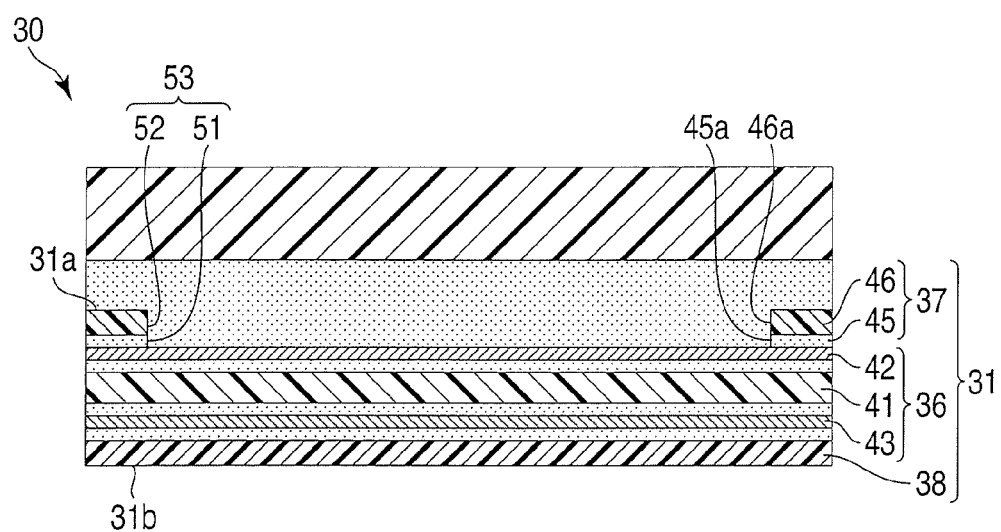
FIG. 5 is an exemplary sectional view of the FPC of the first embodiment taken along line F5-F5 of FIG. 4.

FIG. 3 is an exemplary exploded perspective view of the FPC 30, showing a region enclosed by circle F3 indicated by a two-dot chain line in FIG. 2. FIG. 4 is an exemplary sectional view of the FPC 30 taken along line F4-F4 of FIG. 3. FIG. 5 is an exemplary sectional view of the FPC taken along line F5-F5 of FIG. 4.

As shown in FIG. 4, the board body 31 comprises a base layer 36 and first and second covering layers 37 and 38. The first covering layer 37 is an example of the covering layer. The first covering layer 37 is laminated to one surface of the base layer 36. The second covering layer 38 is laminated to the other surface of the base layer 36.

The base layer 36 comprises a flexible base portion 41 and first and second conductive portions 42 and 43. The first conductive portion 42 is an example of the conductive portion. The base portion 41 is formed by, for example, laminating a thermosetting adhesive to both surfaces of a base layer film of polyimide. The base portion 41 is not limited to this arrangement and may alternatively be formed of a base layer film only or a combination of a plurality of films and copper foils laminated to one another with an adhesive therebetween.

The first conductive portion 42 is, for example, a copper foil, which is laminated to one surface of the base portion 41. In other words, the first conductive portion 42 is superposed on the base portion 41. The first conductive portion 42 is etched to form a conductor pattern.

The second conductive portion 43 is, for example, a copper foil, which is laminated to the other surface of the base portion 41. The second conductive portion 43 is etched to form a conductor pattern.

The first covering layer 37 comprises a first adhesive portion 45 and flexible cover portion 46. The first adhesive portion 45 is, for example, a thermosetting acrylic adhesive with electrical insulating properties. However, the first adhesive portion 45 is not limited to this material and may be another adhesive, such as a thermosetting epoxy adhesive, or an adhesive sheet. The first adhesive portion 45 is laminated to the first conductive portion 42. In other words, the first adhesive portion 45 is superposed on the first conductive portion 42.

As shown in FIG. 4, the first adhesive portion 45 comprises a plurality of first openings 51 that penetrate the first adhesive portion 45. As shown in FIG. 2, the first openings 51 are separated from a peripheral edge 31c of the board body 31 and also from an inner edge 31d of the board body 31 that defines a first hole 34. Each of edges 31c and 31d is an example of the edge of the board body. As shown in FIG. 3, the first openings 51 extend parallel to one another.

The cover portion 46 is a so-called covering film of, for example, polyimide. The cover portion 46 is laminated to the first adhesive portion 45. In other words, the cover portion 46 is superposed on the first adhesive portion 45. The cover portion 46 defines the first surface 31a of the board body 31.

The cover portion 46 comprises second openings 52 as many as the first openings 51. The second openings 52 penetrate the cover portion 46. Each second opening 52 has the same width and shape as each first opening 51. As shown in FIG. 4, the second openings 52 are continuous with their corresponding first openings 51. Thus, the first and second openings 51 and 52 form a plurality of continuous apertures 53 in the first covering layer 37.

The first and second openings 51 and 52 are formed by, for example, die-punching the first covering layer 37. The die-punching of the first covering layer 37 is also performed in forming, for example, the first hole 34 or the outer periphery of the first covering layer 37. Thus, the first and second openings 51 and 52 are formed simultaneously with the first hole 34 and the outer periphery of the first covering layer 37. The openings 51 and 52 may alternatively be formed by means of a cutter or other tool or formed independently of the first hole 34 and the outer periphery of the first covering layer 37.

The second covering layer 38 is formed by, for example, laminating a thermosetting adhesive to one surface of a flexible polyimide covering film. The second covering layer 38 forms the second surface 31b of the board body 31.

The reinforcement plates 32 and 33 are rigid and substantially rectangular. The reinforcement plates 32 and 33 are formed of so-called FR4 comprising glass cloth impregnated with a resin. The reinforcement plates 32 and 33 are not limited to this material and may be formed of another material harder than the board body 31.

The reinforcement plates 32 and 33 are individually opposed to the cover portion 46 of the first covering layer 37. In other words, the reinforcement plates 32 and 33 are individually superposed on the cover portion 46 of the first covering layer 37. As shown in FIG. 2, the reinforcement plate 32 comprises a second hole 55, which corresponds in position to the first hole 34. Thus, the first and second openings 51 and 52 are spaced apart from a peripheral edge 32a of the reinforcement plate 32. Further, the openings 51 and 52 are also spaced apart from a peripheral edge 32b of the reinforcement plate 32 that defines the second hole 55. Each of edges 32a and 32b is an example of the edge of the reinforcement plate.

As shown in FIG. 4, a second adhesive portion 57 is interposed between the reinforcement plate 32 and the cover portion 46 of the first covering layer 37. The second adhesive portion 57 is, for example, a thermosetting acrylic adhesive. Alternatively, for example, the second adhesive portion 57 may be another adhesive, such as a thermosetting epoxy adhesive, or an adhesive sheet. The second adhesive portion 57 is an example of the adhesive interposed between the covering layer and reinforcement plate. The reinforcement plate 32 is secured to the cover portion 46 by the second adhesive portion 57.

A part of the second adhesive portion 57 penetrates and fills the first and second openings 51 and 52. In other words, a part of the second adhesive portion 57 is located within the openings 51 and 52. The second adhesive portion 57 adheres to edges 45a of the first adhesive portion 45 that define the first openings 51 and further to edges 46a of the cover portion 46 that define the second openings 52.

The reinforcement plate 33, like the reinforcement plate 32, is attached to the first surface 31a of the board body 31, as shown in FIG. 2. Thus, the second adhesive portion 57 is interposed between the reinforcement plate 33 and first covering layer 37 and penetrates the first and second openings 51 and 52 of the layer 37.

According to the portable computer 1 and FPC 30 constructed in this manner, the first adhesive portion 45 comprises the first openings 51, while the cover portion 46 comprises the second openings 52 that are continuous with the first openings 51. A part of the second adhesive portion 57 penetrates the openings 51 and 52. Accordingly, the area of contact between the second adhesive portion 57 and board body 31 is so large that the second adhesive portion 57 is firmly secured to the board body 31. Thus, the reinforcement plate 32 becomes less likely to separate from the first covering layer 37.

The first and second openings 51 and 52 can be formed by a simple method, such as punching. Further, the openings 51 and 52 can be formed simultaneously with the first hole 34 and the outer periphery of the first covering layer 37. Thus, the reinforcement plate 32 can be made less likely to separate from the first covering layer 37.

Evaporated water is liable to collect and air bubbles are easily formed in regions distant from the peripheral and inner edges 31c and 31d of the board body 31 and the peripheral and inner edges 32a and 32b of the reinforcement plate 32. The first and second openings 51 and 52 are located in positions where such air bubbles are easily formed. Thus, easily separable parts of the reinforcement plate 32 are firmly secured to the board body 31, so that the reinforcement plate 32 becomes less likely to separate from the first covering layer 37.

A second embodiment will now be described with reference to FIGS. 6 and 7. Like reference numbers are used to designate those constituent parts which have the same functions as their counterparts in the portable computer 1 and FPC 30 of the first embodiment, and a description of those parts is omitted.

Figure 6:
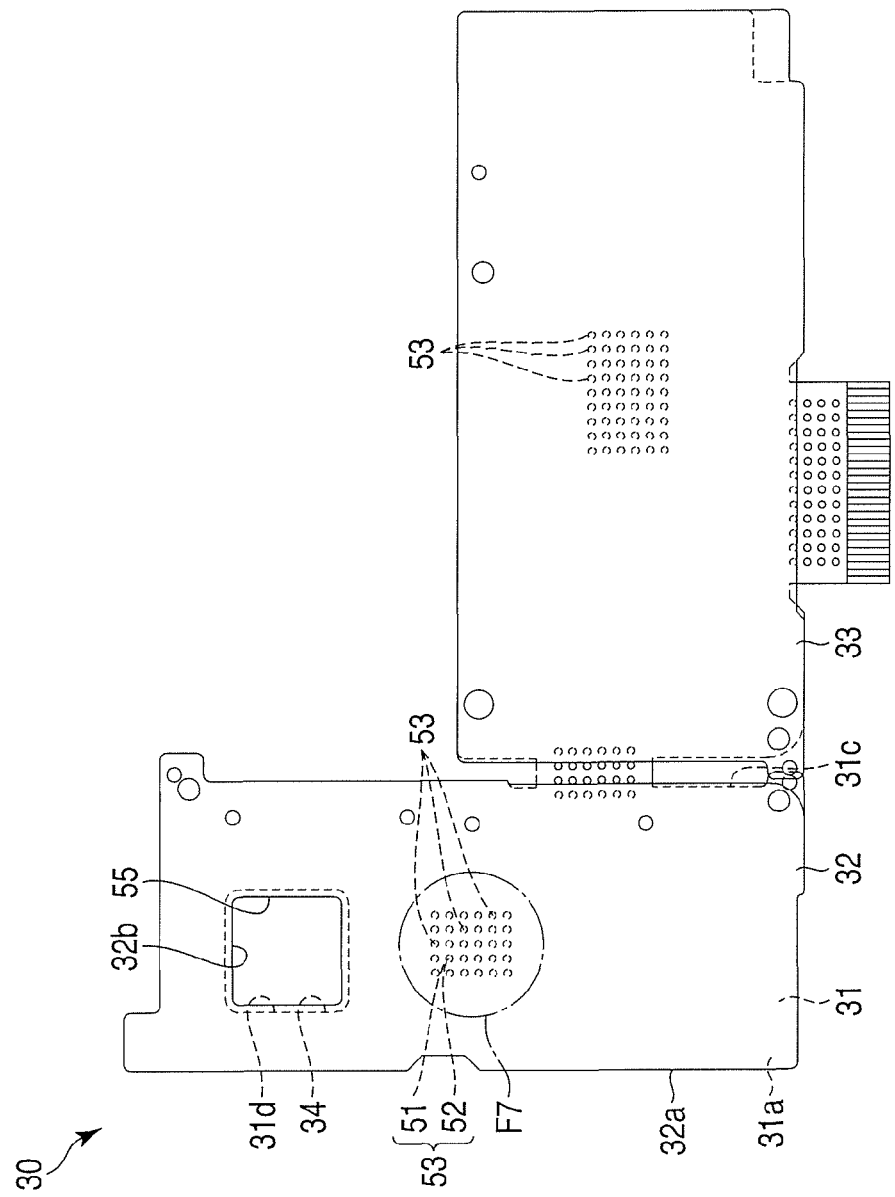
FIG. 6 is an exemplary plan view showing an FPC according to a second embodiment.
Figure 7:
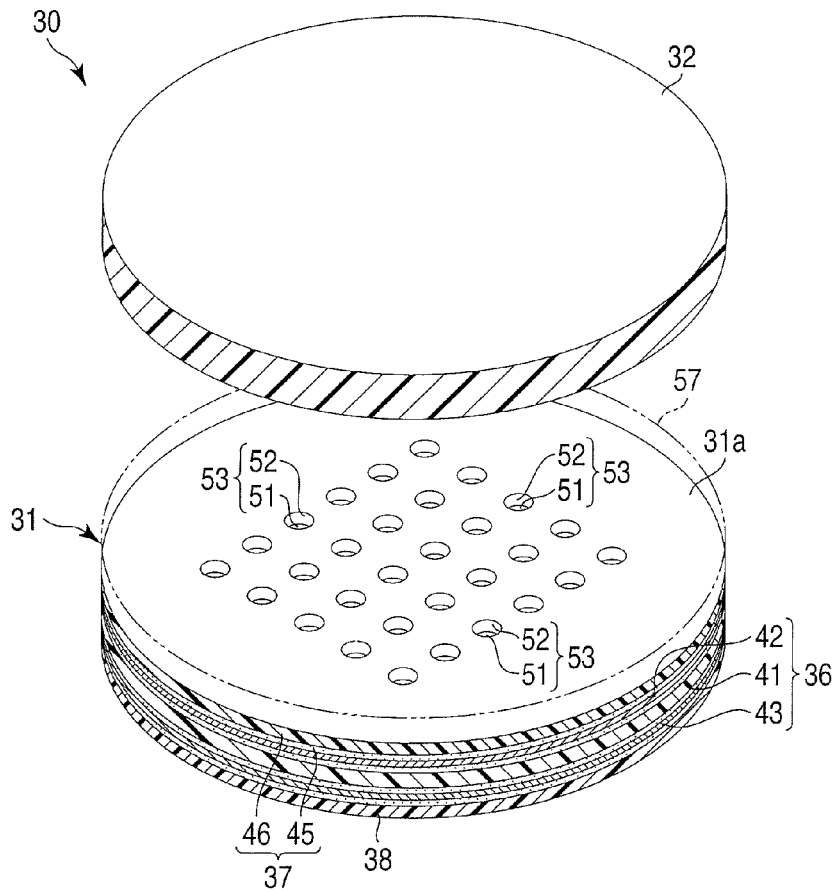
FIG. 7 is an exemplary exploded perspective view of the FPC of the second embodiment, showing a region enclosed by circle F7 in FIG. 6.

FIG. 6 is an exemplary plan view showing an FPC 30 of the second embodiment. FIG. 7 is an exemplary exploded perspective view of the FPC 30, showing a region enclosed by circle F7 indicated by two-dot chain line in FIG. 6. As shown in FIG. 7, a plurality of first openings 51 and a plurality of second openings 52 are circular holes arranged in a matrix. In other words, the first and second openings 51 and 52 form a first covering layer 37 in a mesh.

The first and second openings 51 and 52 of the second embodiment are greater in number than those of the first embodiment. Thus, the area of contact between a second adhesive portion 57 and board body 31 increases, so that the reinforcement plate 32 becomes less likely to separate from the first covering layer 37.

A third embodiment will now be described with reference to FIGS. 8 and 9. Like reference numbers are used to designate those constituent parts which have the same functions as their counterparts in the portable computer 1 and FPC 30 of the first embodiment, and a description of those parts is omitted.

Figure 8:
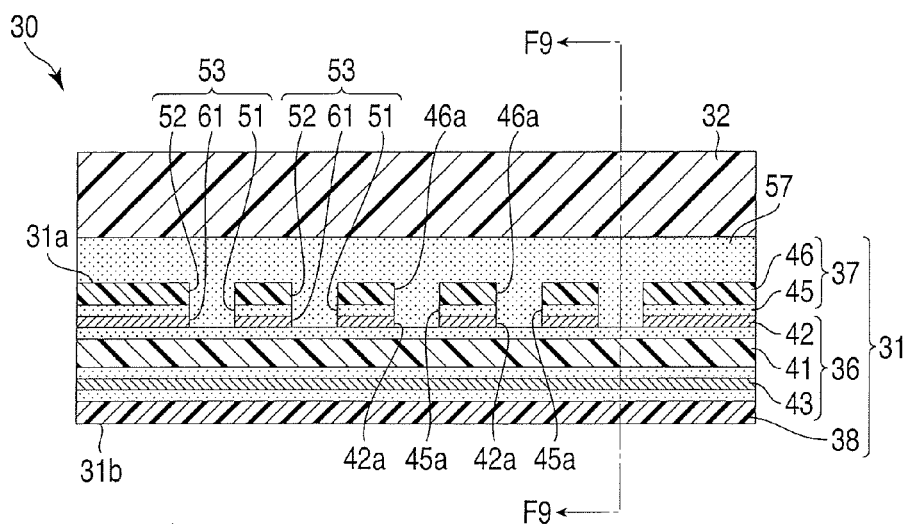
FIG. 8 is an exemplary sectional view showing a part of an FPC according to a third embodiment.
Figure 9:
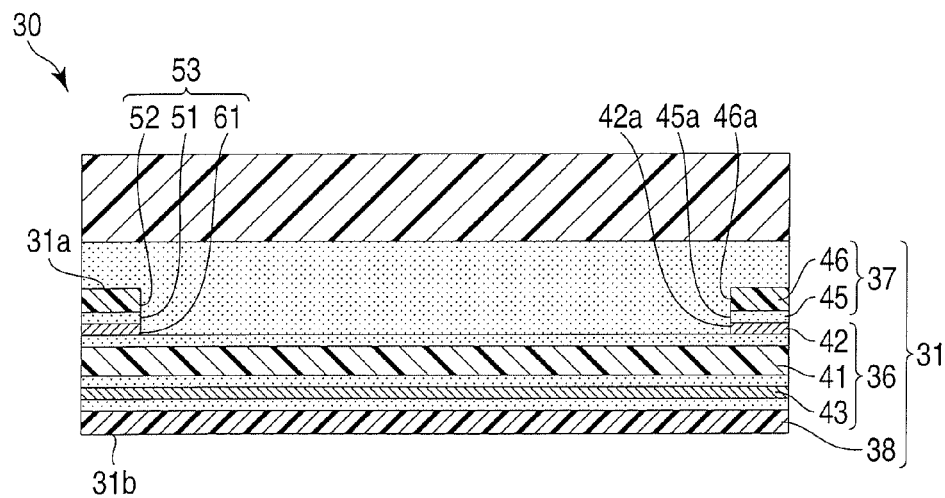
FIG. 9 is an exemplary sectional view of the FPC of the third embodiment taken along line F9-F9 of FIG. 8.

FIG. 8 is an exemplary sectional view showing a part of an FPC 30 of the third embodiment. FIG. 9 is an exemplary sectional view of the FPC 30 taken along line F9-F9 of FIG. 8. As shown in FIG. 8, a first conductive portion 42 comprises a plurality of third openings 61. The third openings 61 are as many as first openings 51. Each third opening 61 has the same width and shape as each first opening 51. The third openings 61 are continuous with their corresponding first openings 51. Thus, the first, second, and third openings 51, 52 and 61 form a plurality of continuous apertures 53 in a board body 31.

The third openings 61 are formed by, for example, etching the first conductive portion 42. The operation for etching the first conductive portion 42 is also performed in forming a conductor pattern on the first conductive portion 42, for example. Therefore, the third openings 61 are formed simultaneously with the conductor pattern on the first conductive portion 42. Alternatively, the third openings 61 may be formed by another method, such as boring with a drill, or formed independently of the conductor pattern on the first conductive portion 42.

A part of a second adhesive portion 57 penetrates and fills the third openings 61. In other words, a part of the second adhesive portion 57 is located within the third openings 61. The second adhesive portion 57 adheres to edges 42a of the first conductive portion 42 that define the third openings 61.

According to the portable computer 1 and FPC 30 constructed in this manner, the first conductive portion 42 comprises the third openings 61, and a part of the second adhesive portion 57 penetrates the third openings 61. Accordingly, the apertures 53 in the board body 31 are deeper than those of the first embodiment, so that the area of contact between the second adhesive portion 57 and board body 31 is larger. Thus, the reinforcement plate 32 becomes less likely to separate from the first covering layer 37.

Figure 11:
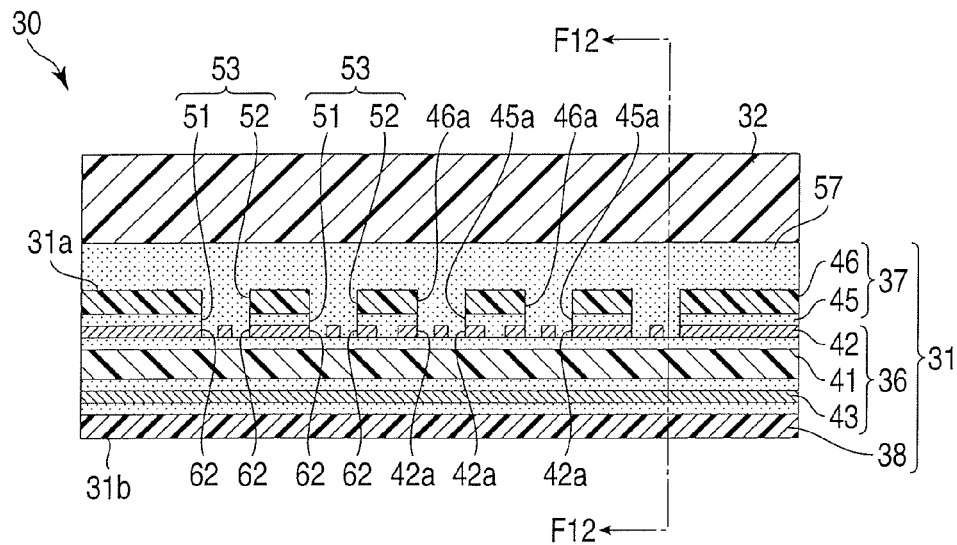
FIG. 11 is an exemplary sectional view of the FPC of the fourth embodiment taken along line F11-F11 of FIG. 10.
Figure 12:
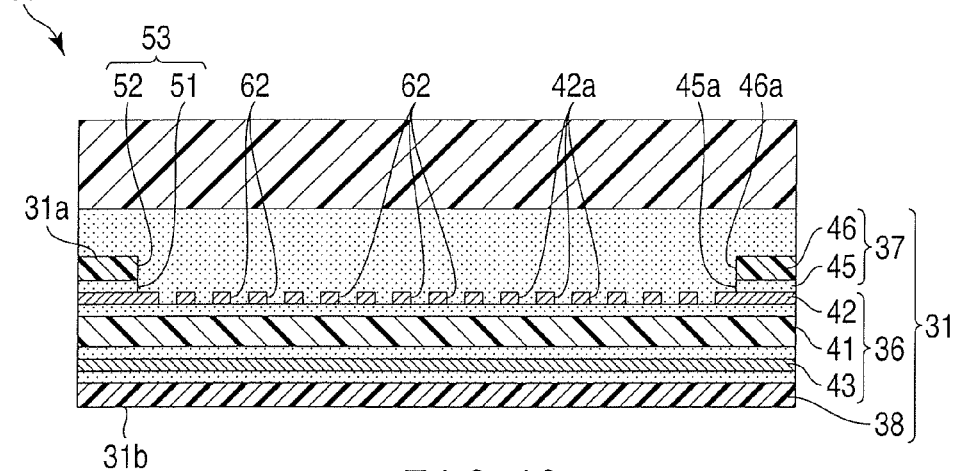
FIG. 12 is an exemplary sectional view of the FPC of the fourth embodiment taken along line F12-F12 of FIG. 11.

A fourth embodiment will now be described with reference to FIGS. 10 to 12. Like reference numbers are used to designate those constituent parts which have the same functions as their counterparts in the portable computer 1 and FPC 30 of the third embodiment, and a description of those parts is omitted.

Figure 10:
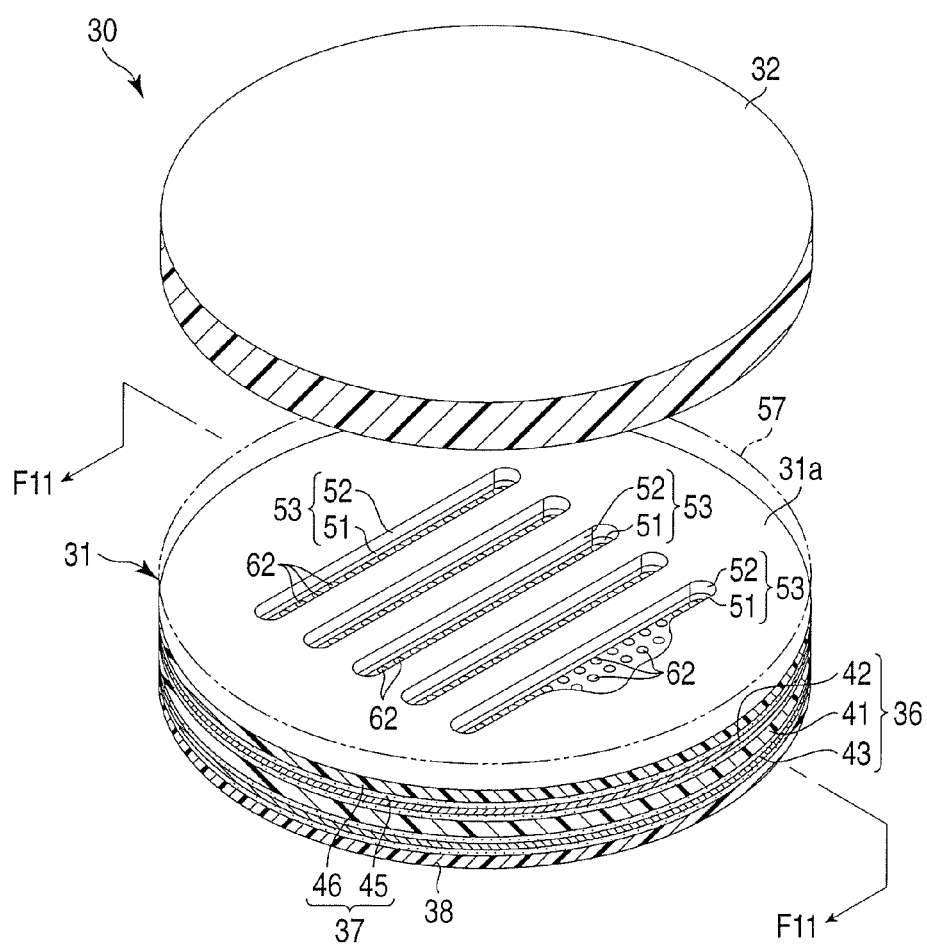
FIG. 10 is an exemplary exploded perspective view showing a part of an FPC according to a fourth embodiment.

FIG. 10 is an exemplary exploded perspective view showing a part of an FPC 30 of the fourth embodiment. FIGS. 11 and 12 are exemplary sectional views of the FPC 30 taken along lines F11-F11 and F12-F12, respectively, of FIG. 10.

As shown in FIG. 10, a first conductive portion 42 comprises a plurality of third openings 62. The third openings 62 are each in the form of a circle smaller than each of first openings 51 and are greater in number the first openings 51. The third openings 62 are arranged individually at the respective bottom portions of apertures 53 formed in a first covering layer 37. As shown in FIG. 11, the third openings 62 are continuous with their corresponding first openings 51.

The third openings 62 of the fourth embodiment are greater in number than the third openings 61 of the third embodiment. Accordingly, the area of contact between a second adhesive portion 57 and board body 31 is so large that a reinforcement plate 32 becomes less likely to separate from the first covering layer 37.

A fifth embodiment will now be described with reference to FIG. 13. Like reference numbers are used to designate those constituent parts which have the same functions as their counterparts in the portable computer 1 and FPC 30 of the first embodiment, and a description of those parts is omitted.

Figure 13:
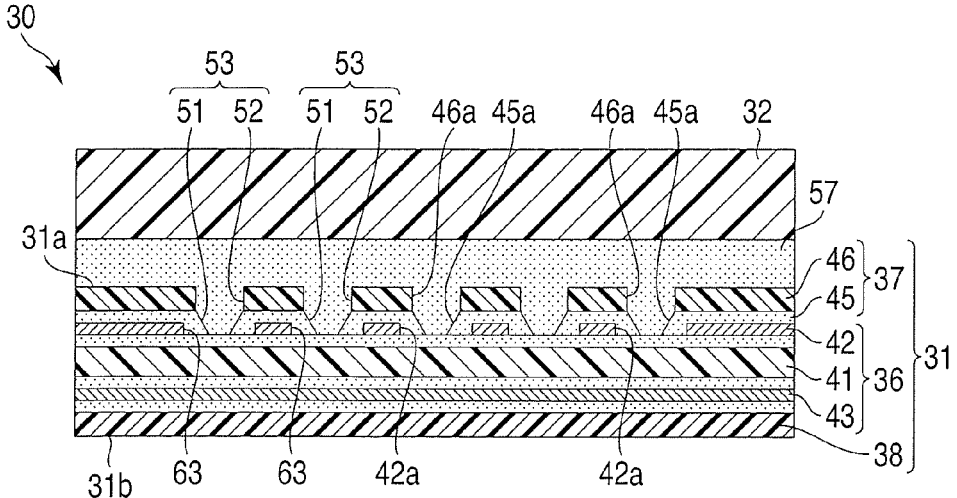
FIG. 13 is an exemplary sectional view showing an FPC according to a fifth embodiment.

FIG. 13 is an exemplary sectional view showing a part of an FPC 30 of the fifth embodiment. As shown in FIG. 13, a first conductive portion 42 comprises fourth openings 63 as many as first openings 51. The fourth openings 63 are located corresponding individually to the first openings 51 and are wider than their corresponding first openings 51. Alternatively, the fourth openings 63 may be as wide as the first openings 51.

A part of a first adhesive portion 45 penetrates the fourth openings 63. Thus, apertures 53 in a first covering layer 37 defined by first and second openings 51 and 52 are formed extending from a first surface 31a of a board body 31 to a base portion 41.

Within each fourth opening 63, the first adhesive portion 45 is interposed between the first conductive portion 42 and a part of a second adhesive portion 57 that penetrates each first opening 51. Since the first adhesive portion 45 is electrically insulating, it can prevent electrical connection between the second adhesive portion 57 and first conductive portion 42.

According to the portable computer 1 and FPC 30 constructed in this manner, the insulating first adhesive portion 45 is interposed between the second adhesive portion 57 and first conductive portion 42. Even if the second adhesive portion 57 is electrically conductive, therefore, the first conductive portion 42 can prevent short-circuiting.

Since the first adhesive portion 45 is insulating, moreover, the first conductive portion 42 is not affected by the potential, heterogeneous or homogeneous, of the FPC 30 in positions where reinforcement plates 32 and 33 are mounted only if it is covered by the first adhesive portion 45.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing; and
a flexible printed circuit board accommodated in the housing, wherein the flexible printed circuit board comprises (1) a base portion, (2) an electrically conductive portion laminated to the base portion, (3) a first adhesive portion being electrically insulating, laminated to the electrically conductive portion and comprising a first opening, (4) a cover portion laminated to the first adhesive portion and comprising a second opening continuous with the first opening, (5) a rigid reinforcement plate opposed to the cover portion, and (6) a second adhesive portion partially residing in the first and second openings and interposed between the cover portion and the reinforcement plate,
wherein the electrically conductive portion comprises at least one third opening adapted to receive a part of the second adhesive portion, and
the first adhesive portion is interposed between the electrically conductive portion and a part of the second adhesive portion which partially resides in the first opening.

2. The electronic apparatus of claim 1, wherein a part of the second adhesive portion adheres to an edge of the first adhesive portion which defines the first opening and an edge of the cover portion which defines the second opening.

3. The electronic apparatus of claim 2, wherein the conductive portion comprises at least one third opening continuous with the first opening and penetrated by the second adhesive portion.

4. The electronic apparatus of claim 3, wherein the flexible printed circuit board comprises a board body comprising the base portion, the electrically conductive portion, the first adhesive portion, and the cover portion, and the first and second openings are spaced apart from respective edges of the board body and the reinforcement plate.

5. The electronic apparatus of claim 1, wherein the flexible printed circuit board comprises a board body comprising the base portion, the electrically conductive portion, the first adhesive portion, and the cover portion, and the first and second openings are spaced apart from respective edges of the board body and the reinforcement plate.

6. The electronic apparatus of claim 1, wherein the third opening is located at a position corresponding to a position of the first opening.

7. The electronic apparatus of claim 1, wherein a part of the first adhesive portion is interposed between the electrically conductive portion and the part of the second adhesive portion which partially resides in the third opening.

8. The electronic apparatus of claim 1, wherein a part of the first adhesive portion is interposed inside the third opening between the electrically conductive portion and the second adhesive portion.

9. The electronic apparatus of claim 1, wherein the first adhesive portion covers the entire electrically conductive portion.

10. The electronic apparatus of claim 1, wherein the first adhesive portion electrically insulates the entire electrically conductive portion and the second adhesive portion.

11. The electronic apparatus of claim 1, wherein the second adhesive portion is partially interposed between the cover portion and the reinforcement plate.

12. The electronic apparatus of claim 1, wherein the second adhesive portion is electrically conductive.

13. A flexible printed circuit board comprising:
a base portion;
an electrically conductive portion superposed on the base portion;
a first adhesive portion being electrically insulating, superposed on the electrically conductive portion and comprising a first opening;
a cover portion superposed on the first adhesive portion and comprising a second opening continuous with the first opening;
a reinforcement plate overlapping the cover portion; and
a second adhesive portion interposed between the cover portion and the reinforcement plate and partially located in the first and second openings,
wherein the electrically conductive portion comprises at least one third opening in which a part of the second adhesive portion partially resides, and
the first adhesive portion is interposed between the electrically conductive portion and a part of the second adhesive portion which partially resides in the first opening.

14. The flexible printed circuit board of claim 13, wherein a part of the second adhesive portion adheres to an edge of the first adhesive portion which defines the first opening and an edge of the cover portion which defines the second opening.

15. The flexible printed circuit board of claim 14, wherein the conductive portion comprises at least one third opening continuous with the first opening and penetrated by the second adhesive portion.

16. The flexible printed circuit board of claim 13, wherein the third opening is located at a position corresponding to a position of the first opening.

17. The flexible printed circuit board of claim 13, wherein a part of the first adhesive portion is interposed between the electrically conductive portion and the part of the second adhesive portion which partially resides in the third opening.

18. The flexible printed circuit board of claim 13, wherein a part of the first adhesive portion is interposed inside the third opening between the electrically conductive portion and the second adhesive portion.

19. The flexible printed circuit board of claim 13, wherein the first adhesive portion covers the entire electrically conductive portion.

20. The flexible printed circuit board of claim 13, wherein the first adhesive portion electrically insulates the entire electrically conductive portion and the second adhesive portion.

21. The flexible printed circuit board of claim 13, wherein the second adhesive portion is partially interposed between the cover portion and the reinforcement plate.

22. The flexible printed circuit board of claim 13, wherein the second adhesive portion is electrically conductive.

* * * * *